United States Patent
Matsumoto

(10) Patent No.: US 8,890,498 B2
(45) Date of Patent: Nov. 18, 2014

(54) DRIVING CIRCUIT TO TURN OFF SWITCHING ELEMENT BY VOLTAGE FROM VOLTAGE STORAGE UNIT AND CONVERTER INCLUDING DRIVING CIRCUIT

(75) Inventor: Shinichiro Matsumoto, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 455 days.

(21) Appl. No.: 12/818,035

(22) Filed: Jun. 17, 2010

(65) Prior Publication Data

US 2010/0321070 A1    Dec. 23, 2010

(30) Foreign Application Priority Data

Jun. 23, 2009    (JP) .................. 2009-149066

(51) Int. Cl.
*G05F 1/00* (2006.01)
*H02M 3/155* (2006.01)
*H03K 17/06* (2006.01)

(52) U.S. Cl.
CPC ............. *H02M 3/155* (2013.01); *H03K 17/063* (2013.01)
USPC ....................................... 323/274

(58) Field of Classification Search
USPC ......... 323/234, 237–238, 266, 273–274, 276, 323/282, 284
See application file for complete search history.

(56) References Cited

U.S. PATENT DOCUMENTS

| | | | | |
|---|---|---|---|---|
| 6,081,107 A | * | 6/2000 | Marino | 323/282 |
| 8,237,419 B2 | * | 8/2012 | Schroeder et al. | 323/277 |
| 2007/0115038 A1 | * | 5/2007 | Higashi et al. | 327/207 |
| 2008/0157844 A1 | * | 7/2008 | Ren | 327/290 |
| 2008/0192512 A1 | * | 8/2008 | Zheng et al. | 363/18 |
| 2009/0212753 A1 | * | 8/2009 | Lou | 323/277 |

FOREIGN PATENT DOCUMENTS

| | | | |
|---|---|---|---|
| JP | 2668582 B2 | | 10/1997 |
| JP | 2668582 B2 | * | 10/1997 |
| JP | 2000-23355 A | | 1/2000 |
| JP | 2000-197354 A | | 7/2000 |
| JP | 2008-125184 A | | 5/2008 |

* cited by examiner

*Primary Examiner* — Adolf Berhane
*Assistant Examiner* — Jeffrey Gblende
(74) *Attorney, Agent, or Firm* — Canon USA, Inc. IP Division

(57) ABSTRACT

A driving circuit in which, during an on-period of a switching element, a voltage applied to the switching element is stored, and during an off-period of the switching element, the stored voltage is supplied to turn off the switching element.

4 Claims, 13 Drawing Sheets

US 8,890,498 B2

DRIVING CIRCUIT TO TURN OFF SWITCHING ELEMENT BY VOLTAGE FROM VOLTAGE STORAGE UNIT AND CONVERTER INCLUDING DRIVING CIRCUIT

BACKGROUND OF THE INVENTION

1. Field of the Invention

The present invention relates to a circuit for driving a field-effect transistor (FET) functioning as a switching element.

2. Description of the Related Art

FIG. 11 illustrates a direct current (DC) voltage converter (hereinafter referred to as a DC/DC converter) including a general FET gate driving circuit as discussed in Japanese Patent Application Laid-Open No. 2000-23355. The DC/DC converter is a step-down DC/DC converter, which is a type of the DC/DC converter, and an FET 30 receives an input voltage Vin of the step-down DC/DC converter. Generally, a P-channel FET is used as such an FET used in the step-down DC/DC converter, and a gate terminal of the FET 30 is connected to a push pull circuit formed by transistors 27 and 28 functioning as switch elements via a resistor 29. This push pull circuit is used to increase the speed of charging and discharging electric charges supplied to the gate of the FET 30 and hence to increase the switching speed of the FET 30. The push pull circuit is connected to a PWM circuit formed by resistors 25 and 24, a transistor 26, comparators 23 and 22, a triangular wave generator (oscillator (OSC)) 20, and a constant voltage source 21. Thus, the FET 30 receives a PWM switching pulse and executes a switching operation, based on the output voltage difference information fed back to the comparator 22. In this way, an inductor 31 and a diode 32 receive a pulse voltage.

The inductor 31, the diode 32, and an electrolytic capacitor 33 convert the pulse voltage to a DC output voltage Vout. Resistors 34 and 35 divide the output voltage Vout, and the comparator 22 receives the divided voltage. Thus, as described above, the FET 30 executes a PWM switching based on the output voltage (Vout) difference information. In this way, the output voltage Vout is made to have a constant level.

In recent years, along with the advancement of techniques of miniaturizing semiconductor devices, a metal-oxide-semiconductor field-effect transistor (MOSFET) having a low threshold voltage of a gate-source voltage Vgs (hereinafter referred to as an on-threshold voltage) is generally used as such an FET used in the above driving circuit. For example, previous-generation MOSFETs generally have the following standards for the on-threshold voltage and a MOSFET turn-off voltage (hereinafter referred to as a cutoff voltage): Vgs on-threshold voltage: 4.0 V (minimum), and Vgs cutoff voltage: 1.5 V (minimum) to 2.5 V (maximum). However, the recent trend of miniaturization of semiconductor devices has made the following standards more common: Vgs on-threshold voltage: 2.5 V (minimum), and Vgs cutoff voltage: 0.5 V (minimum) to 1.5 V (maximum). Thus, the Vgs cutoff voltage tends to decrease as the Vgs on-threshold voltage decreases.

If a MOSFET having a low Vgs on-threshold voltage as described above is used as the switching FET used in the above step-down DC/DC converter (FIG. 11), the following problems remain. The following description will be made based on an example where a MOSFET having a Vgs on-threshold voltage of 2.5 V (minimum) is used.

FIG. 12 illustrates a circuit operation of a step-down DC/DC converter using a MOSFET having a low Vgs on-threshold voltage. FIG. 13 illustrates a waveform of a gate terminal voltage of the MOSFET (hereinafter referred to as FET 30) obtained when the step-down DC/DC converter of FIG. 12 operates. In FIG. 13, during a period when the transistor 26 is turned off (from time t3 to time t5), the transistor 27 is turned on, and the FET 30 is turned off. Since the transistor 27 operates as an emitter follower circuit, a base-emitter voltage Vbe of the transistor 27 becomes approximately equal to a collector-emitter voltage Vice of the transistor 27. Generally, a transistor has a base-emitter voltage Vbe of approximately 0.7 V. Thus, the FET 30 has a Vgs cutoff voltage of approximately 0.7 V, which is approximately equal to the base-emitter voltage Vbe of the transistor 27.

As described above, an FET having a low Vgs on-threshold voltage also has a low Vgs cutoff voltage. Generally, if the Vgs on-threshold voltage of an FET is 2.5 V (minimum), the cutoff voltage of the FET is set to be 0.5 V (minimum) to 1.5 V (maximum). Thus, to turn off this FET completely, it is necessary to set the Vgs cutoff voltage to 0.5V or less. However, as described above, based on the circuit configuration of FIG. 11 (circuit operation of FIG. 12), the Vgs cutoff voltage is approximately 0.7 V; that is, the Vgs cutoff voltage cannot be set to 0.5 V or less. Since the FET 30 cannot be turned off completely, the FET 30 remains in an on state, resulting in problematic heat generation or a defective operation of the DC/DC converter.

SUMMARY OF THE INVENTION

According to an aspect of the present invention, a driving circuit includes a driving unit configured to drive a switching element and a storage unit configured to store a voltage applied to the switching element during an on-period of the switching element. The voltage stored by the storage unit is supplied to turn off the switching element during an off-period of the switching element.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
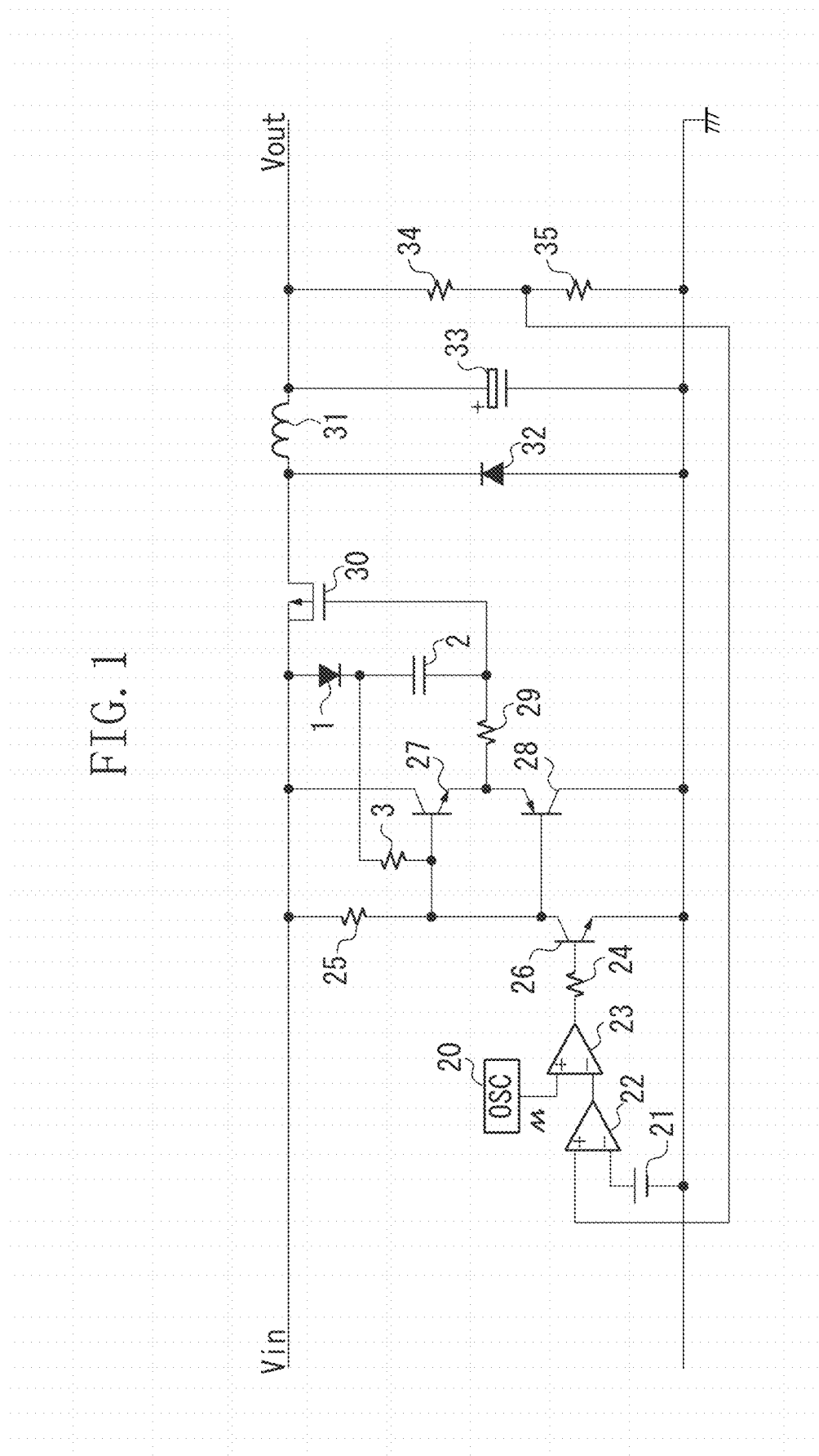
FIG. 1 is a circuit diagram of a step-down DC/DC converter according to a first exemplary embodiment of the present invention.
Figure 2:
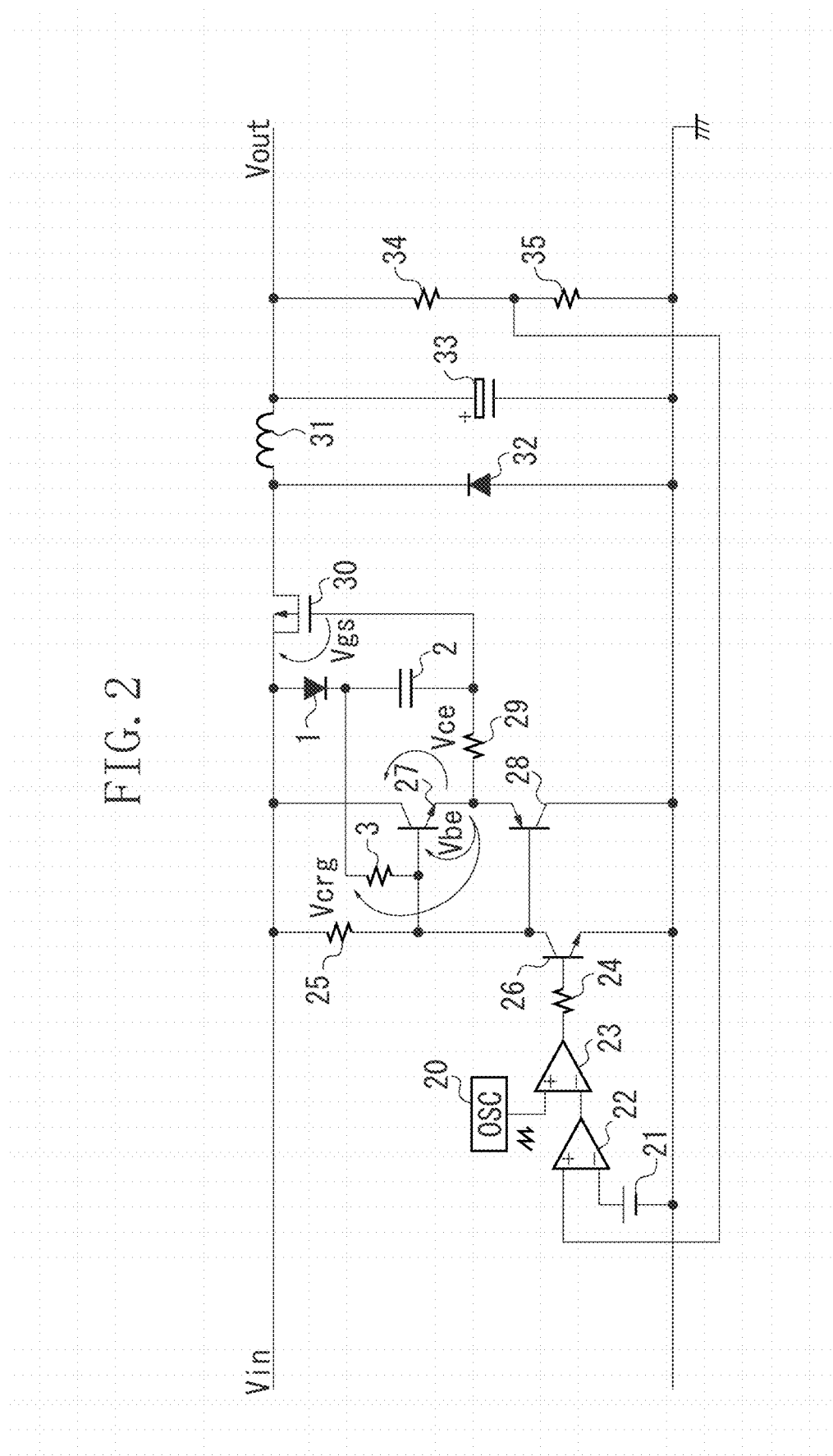
FIG. 2 illustrates a circuit operation of the step-down DC/DC converter according to the first exemplary embodiment.
Figure 3:
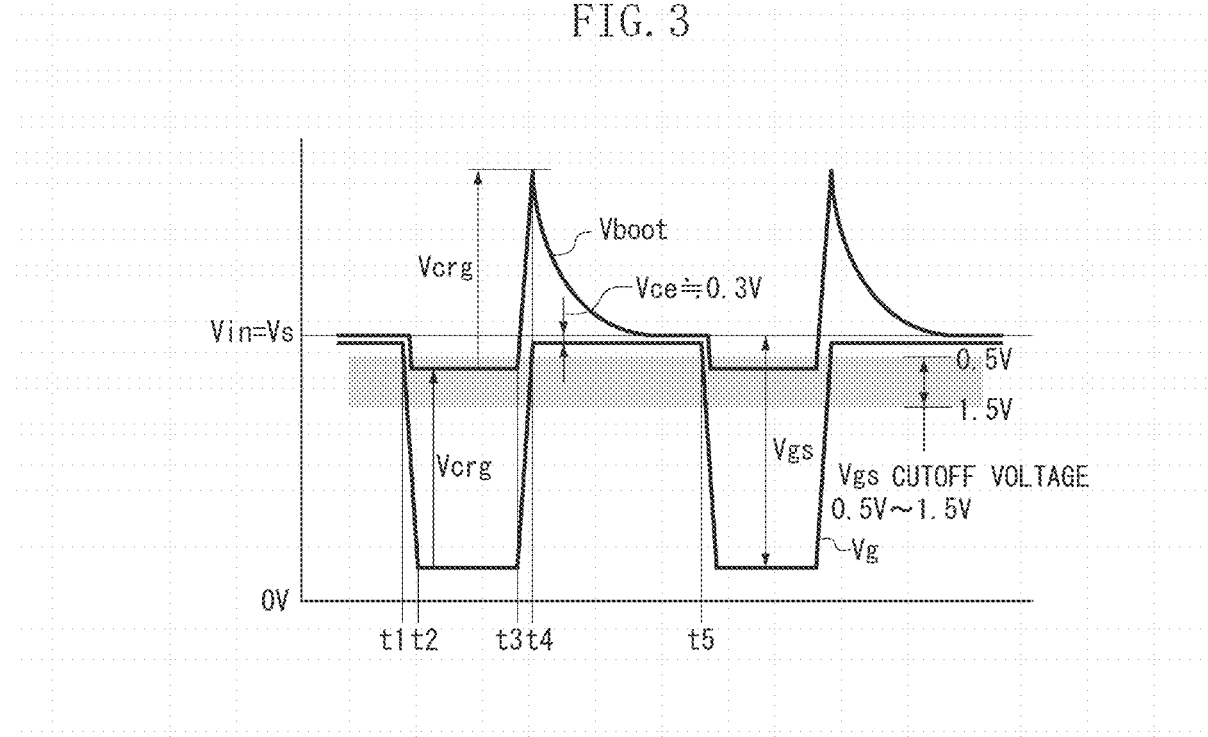
FIG. 3 illustrates voltage waveforms obtained during a circuit operation of the step-down DC/DC converter according to the first exemplary embodiment.

FIG. 1 illustrates a circuit configuration of a step-down DC/DC converter according to a first exemplary embodiment of the present invention. FIG. 2 illustrates a circuit operation of the step-down DC/DC converter of FIG. 1, and FIG. 3 illustrates voltage waveforms obtained when the circuit operates. A P-channel FET (P-channel MOSFET) is used as an FET functioning as a switching element in the step-down DC/DC converter according to the first exemplary embodiment. The parts and elements similar to those of FIG. 11 described above, such as the push pull circuit formed by the transistors 27 and 28 functioning as switch elements, are denoted by the same reference characters, and the description thereof will not be repeated.

Figure 11:
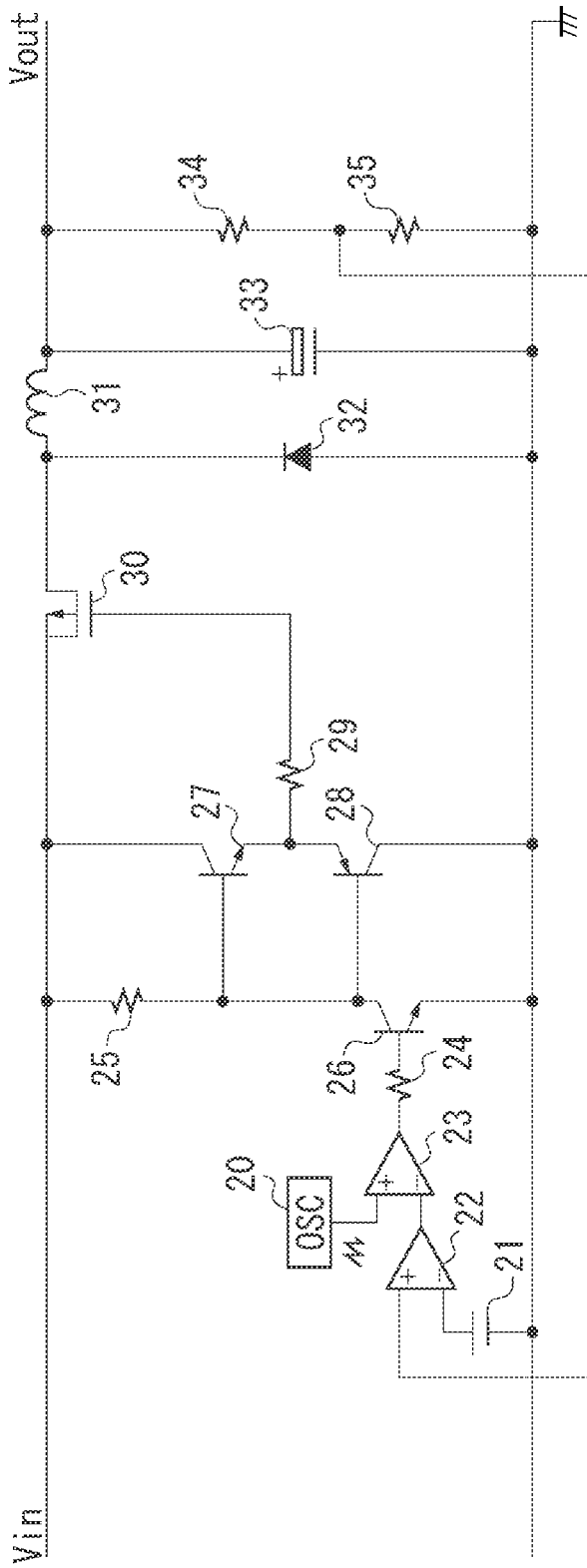
FIG. 11 is a circuit diagram of a conventional step-down DC/DC converter.

The step-down DC/DC converter according to the first exemplary embodiment includes a bootstrap circuit formed by a diode 1 and a capacitor 2, in addition to the elements of the step-down DC/DC converter described with reference to FIGS. 11, 12, and 13. Based on this step-down DC/DC converter, the capacitor 2 is charged with electric charges during an on-period of the FET 30 (period when the FET 30 is turned on). Namely, the capacitor 2 functions as a voltage storage unit and stores a voltage during an on-period of the FET 30. The capacitor 2 discharges the electric charges to turn on the transistor 27 during an off-period of the FET 30 (period when the FET 30 is turned off). Namely, the capacitor 2 supplies the voltage that has been stored therein to turn on the FET 30. This operation decreases the saturation voltage of the transistor 27 and turns off the FET 30 completely.

In FIG. 1, the FET 30 receives the input voltage Vin of the DC/DC converter. The gate terminal of the FET 30 is connected to the push pull circuit, as in FIG. 12. Since the push pull circuit, the PWM switching operation in relation thereto, and the output voltage operation are similar to those of FIG. 12, the description thereof will not be repeated.

Next, an operation of the step-down DC/DC converter will be described based on an example where an FET having a low Vgs on-threshold voltage (threshold voltage of a gate-source voltage Vgs between the gate terminal and the source terminal of the FET) is used as the FET 30. In the first exemplary embodiment, the FET 30 has a Vgs on-threshold voltage of 2.5 V (minimum).

In FIG. 3, during a period when the transistor 26 is turned on (period from time t1 to time t3), the transistor 28 is turned on. During this period, the gate terminal voltage of the FET 30 is decreased to approximately 0 V. Since the gate-source voltage Vgs of the FET 30 becomes approximately equal to the input voltage Vin of the DC/DC converter, the FET 30 turns on. When the FET 30 turns on, a current flows through the diode 1, the capacitor 2, the resistor 29, and the transistor 28 in this order, and the capacitor 2 is charged with a voltage Vcrg approximately equal to the input voltage Vin.

Next, when the transistor 26 is turned off, the transistor 27 is turned on (period from time t3 to time t5). When the transistor 27 is turned on, the gate terminal voltage of the FET 30 is increased toward the input voltage Vin. At this time, since the capacitor 2 has been charged with the voltage Vcrg approximately equal to the input voltage Vin, the diode 1 comes into a reverse bias state. Thus, the voltage with which the capacitor 2 has been charged is discharged through the resistor 3, the base terminal of the transistor 27, the emitter terminal of the transistor 27, and the resistor 29 in this order.

A voltage waveform Vboot in FIG. 3 illustrates the voltage at the connection point of the diode 1 and the capacitor 2, and each of the downward curves of the voltage waveform Vboot indicates the above discharge. The above discharge current flows as a base current of the transistor 27 and saturates the transistor 27. Thus, after the discharge, the collector-emitter voltage Vice of the transistor 27 becomes approximately 0.3 V, which is lower than the base-emitter voltage Vbe (approximately 0.7 V). Therefore, the gate-source voltage Vgs of the FET 30 is also decreased to approximately 0.3 V.

This FET 30 having a Vgs on-threshold voltage of 2.5 V (minimum) is set to have a cutoff voltage of 0.5 V (minimum) to 1.5 V (maximum). Thus, to turn off the FET 30 completely, it is necessary to decrease the gate-source voltage Vgs to be 0.5 V or less. In the first exemplary embodiment, as described above, since the gate-source voltage Vgs is decreased to approximately 0.3 V, the FET 30 can be turned off completely and the circuit operation can be stabilized.

An outline of the circuit and the circuit operation of FIG. 1 will be hereinafter described. The gate terminal of the FET 30 is connected to the emitter terminal of the NPN transistor 27, and the source terminal of the FET 30 is connected to the collector terminal of the NPN transistor 27. The source terminal of the FET 30 is connected to the anode terminal of the diode 1, and the capacitor 2 is connected to the cathode terminal of the diode 1 and the gate terminal of the FET 30. The base terminal of the NPN transistor 27 is connected to the connection point of the cathode terminal of the diode 1 and the capacitor 2.

During an on-period of the FET 30, the capacitor 2 is charged with a voltage applied between the gate terminal and the source terminal of the FET 30, and during an off-period of the FET 30, the capacitor 2 supplies a base current to the NPN transistor 27.

Figure 4:
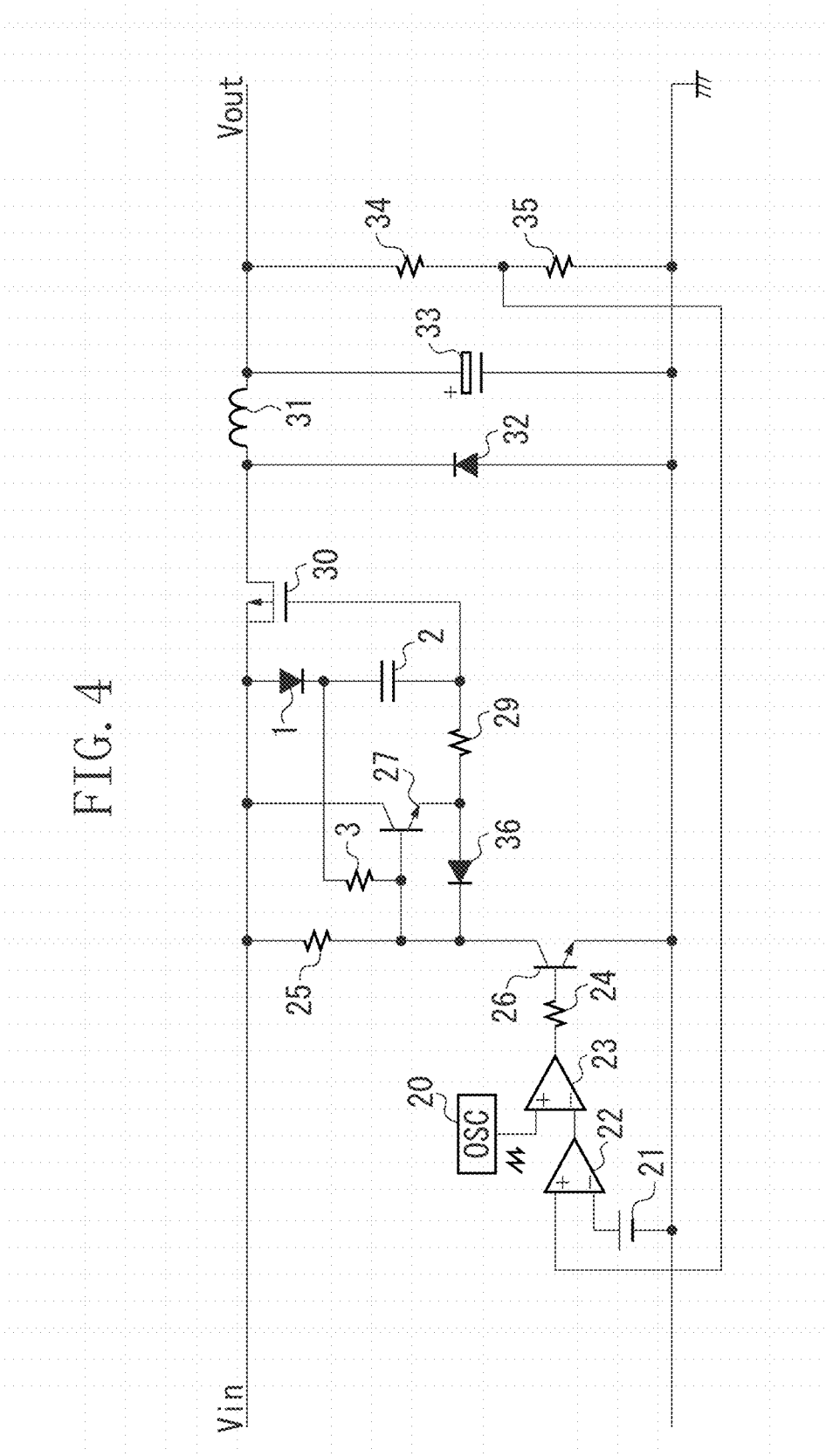
FIG. 4 illustrates a variation of the circuit diagram of the step-down DC/DC converter according to the first exemplary embodiment.

In the DC/DC converter of FIG. 1, a push pull circuit formed by the transistors 27 and 28 is used as a circuit for driving the gate of the FET 30. However, as illustrated in FIG. 4, even when the transistor 28 of the gate driving circuit is replaced with a diode 36, by arranging the bootstrap circuit formed by the diode 1 and the capacitor 2, the FET 30 can be tuned off completely and the circuit operation can be stabilized as described above.

Figure 5:
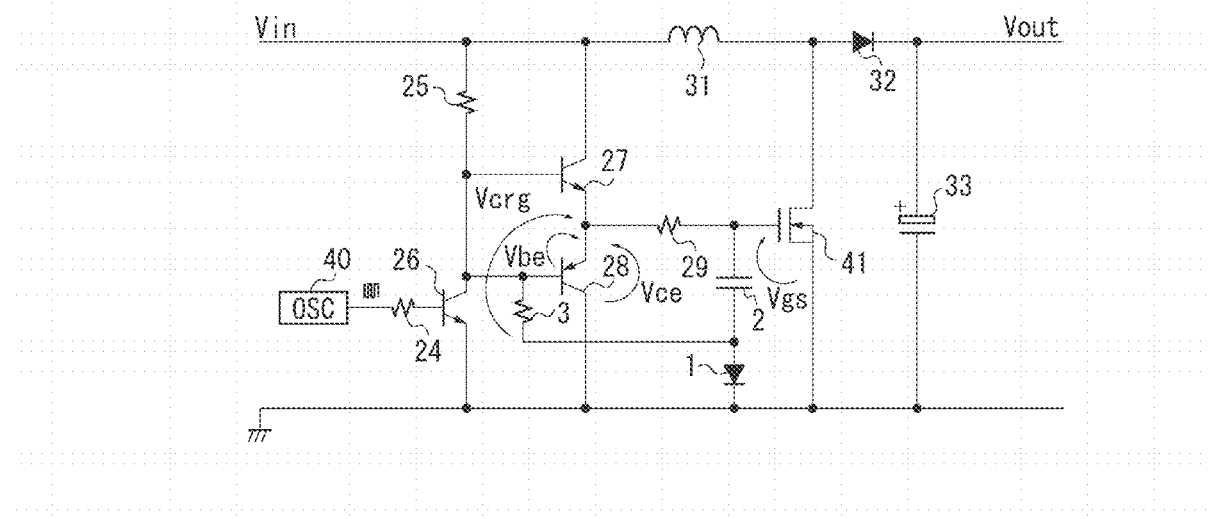
FIG. 5 illustrates a circuit operation of a step-up DC/DC converter according to a second exemplary embodiment of the present invention.
Figure 6:
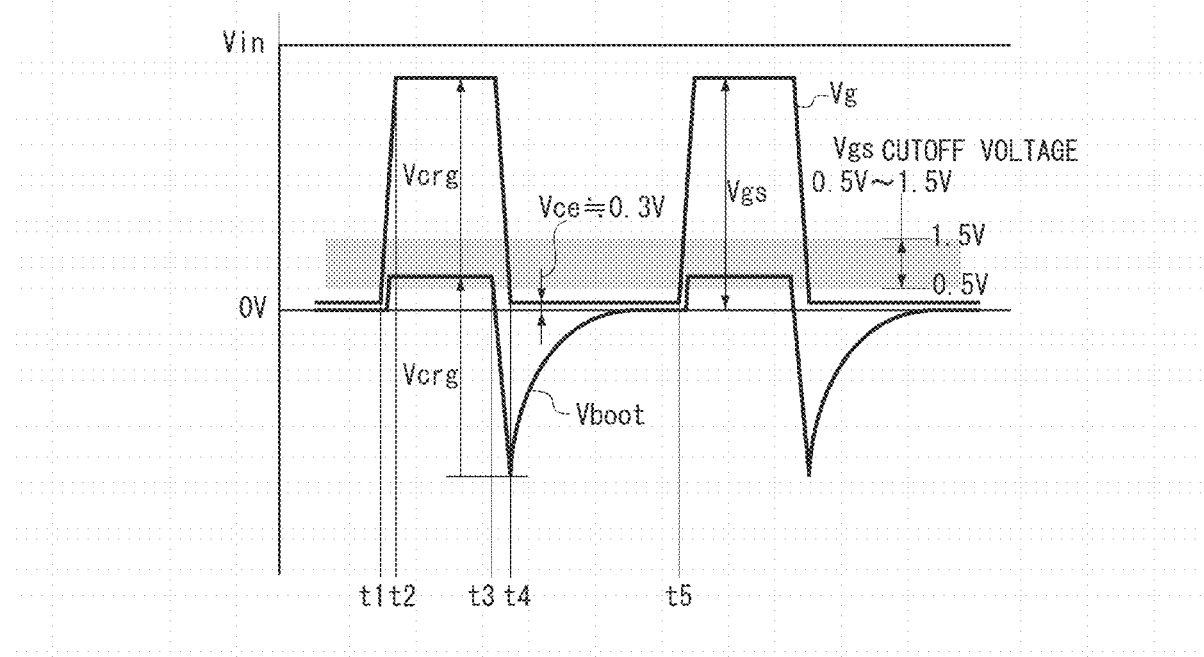
FIG. 6 illustrates voltage waveforms obtained during a circuit operation of the step-up DC/DC converter according to the second exemplary embodiment.

Next, a second exemplary embodiment of the present invention will be described. The first exemplary embodiment has been described based on a circuit configuration of a step-down DC/DC converter. On the other hand, the second exemplary embodiment will be described based on a circuit configuration of a step-up DC/DC converter. FIGS. 5 and 6 illustrate a circuit configuration and a circuit operation of the second exemplary embodiment, respectively. The step-up DC/DC converter according to the second exemplary embodiment will be described based on an example where an N-channel FET (N-channel MOSFET) is used as an FET functioning as a switching element. The parts and elements of the DC/DC converter of the second exemplary embodiment similar to those of FIG. 12 described above are denoted by the same reference characters, and the description thereof will not be repeated.

As in the first exemplary embodiment, the step-up DC/DC converter according to the second exemplary embodiment includes the bootstrap circuit formed by the diode 1 and the capacitor 2, and the capacitor 2 is charged during a turn-on period of an FET 41. During an off-period of the FET 41 (period when the FET 41 is turned off), the voltage with which the capacitor 2 has been charged is used to turn on the transistor 28. In this way, the saturation voltage of the transistor 28 can be decreased, and the FET 41 can be turned off completely.

Figure 12:
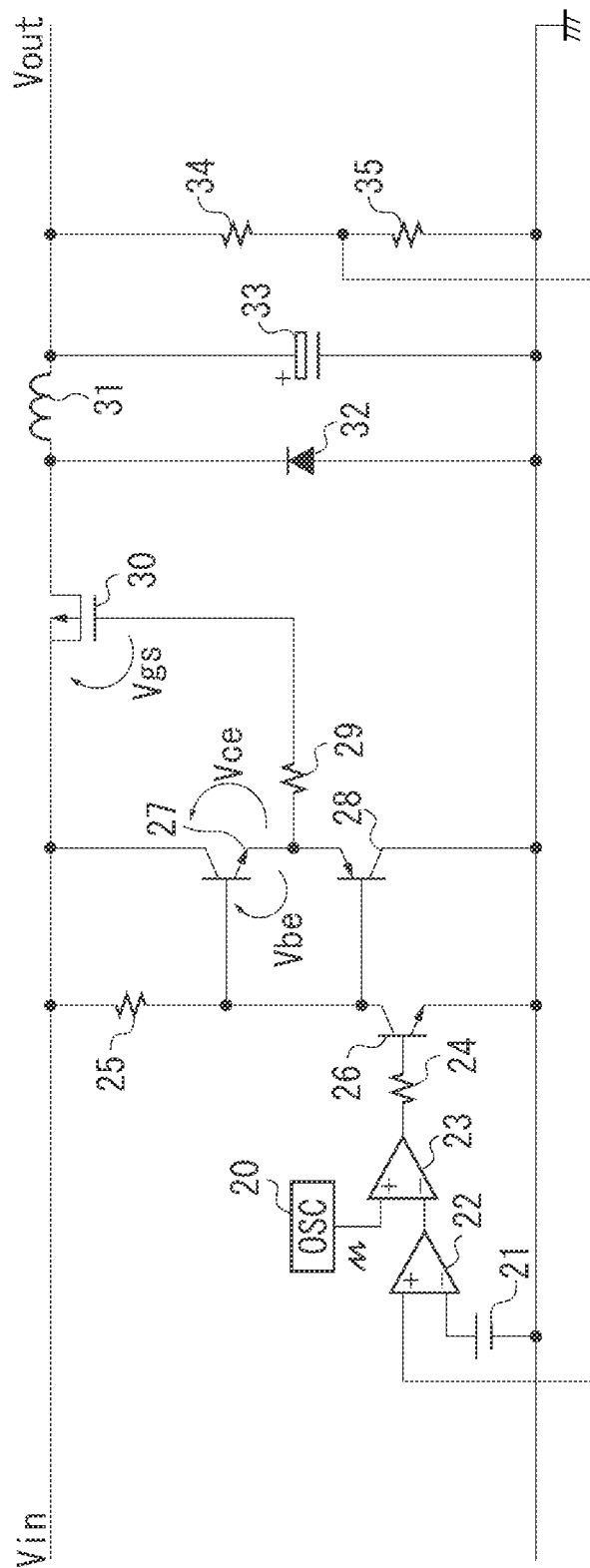
FIG. 12 illustrates a circuit operation of the conventional step-down DC/DC converter.
Figure 13:
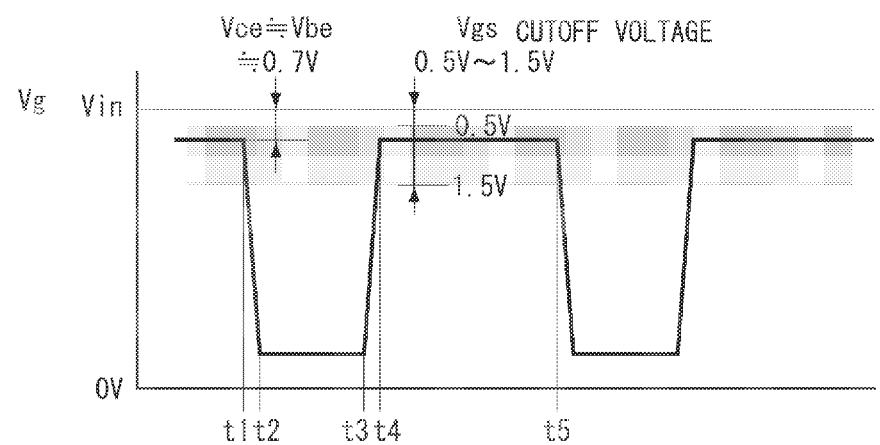
FIG. 13 illustrates voltage waveforms obtained during a circuit operation of the conventional step-down DC/DC converter.

In FIG. 5, the FET 41 receives the input voltage Vin of the DC/DC converter, and the gate terminal of the FET 41 is connected to the push pull circuit, as in FIG. 12. Since the push pull circuit, the PWM switching operation in relation thereto, and the output voltage operation are similar to those of FIG. 12, the description thereof will not be repeated.

Next, an operation of the step-up DC/DC converter will be described based on an example where an FET having a low Vgs on-threshold voltage (threshold voltage of a gate-source voltage Vgs between the gate terminal and the source terminal of the FET) is used as the FET 41. As in the first exemplary embodiment, the FET has a Vgs on-threshold voltage of 2.5 V (minimum) in the second exemplary embodiment.

In FIG. 6, during a period when the transistor 26 functioning as a switch element is turned off (period from time t1 to time t3), the transistor 27 functioning as a switch element is turned on. When the transistor 27 is turned on, the gate terminal voltage of the FET 41 is increased approximately to the input voltage Vin. Since the gate-source voltage Vgs of the FET 41 becomes approximately equal to the input voltage Vin of the DC/DC converter, the FET 41 is turned on. When the FET 41 is turned on, a current flows through the transistor 27, the resistor 29, the capacitor 2, and the diode 1 in this order, and the capacitor 2 is charged with the voltage Vcrg approximately equal to the input voltage Vin.

Next, when the transistor 26 is turned on, the transistor 28 functioning as a switch element is turned on (from time t3 to time t5). When the transistor 28 is turned on, the gate terminal voltage of the FET 41 is decreased toward 0 V. At this time, since the capacitor 2 has been charged with the voltage Vcrg approximately equal to the input voltage Vin, the diode 1 comes into a reverse bias state. Thus, the voltage with which the capacitor 2 has been charged is discharged through the resistor 29, the emitter terminal of the transistor 28, the base terminal of the transistor 28, and the resistor 3 in this order.

A voltage waveform Vboot in FIG. 6 illustrates the voltage at the connection point of the diode 1 and the capacitor 2, and each of the upward curves of the voltage waveform Vboot indicates the above discharge. The above discharge current flows as a base current of the transistor 28 and saturates the transistor 28. Thus, after the discharge, the collector-emitter voltage Vice of the transistor 28 becomes approximately 0.3 V, which is lower than the base-emitter voltage Vbe (approximately 0.7 V). Therefore, the gate-source voltage Vgs of the FET 41 is also decreased to approximately 0.3 V.

This FET 41 having a Vgs on-threshold voltage of 2.5 V (minimum) is set to have a cutoff voltage of 0.5 V (minimum) to 1.5 V (maximum). Thus, to turn off the FET 41 completely, it is necessary to decrease the gate-source voltage Vgs to 0.5 V or less. In the second exemplary embodiment, since the gate-source voltage Vgs is decreased to approximately 0.3 V, the FET 41 can be turned off completely and the circuit operation can be stabilized.

An outline of the circuit and the circuit operation of FIG. 5 will be hereinafter described. The gate terminal of the FET 41 is connected to the emitter terminal of the PNP transistor 28, and the source terminal of the FET 41 is connected to the collector terminal of the PNP transistor 28. The source terminal of the FET 41 is connected to the cathode terminal of the diode 1, and the capacitor 2 is connected to the anode terminal of the diode 1 and the gate terminal of the FET 41. The base terminal of the PNP transistor 28 is connected to the connection point of the anode terminal of the diode 1 and the capacitor 2.

During an on-period of the FET 41, the capacitor 2 is charged with a voltage applied between the gate terminal and the source terminal of the FET 41, and during an off-period of the FET 41, the capacitor 2 supplies a base current to the PNP transistor 28.

Figure 7:
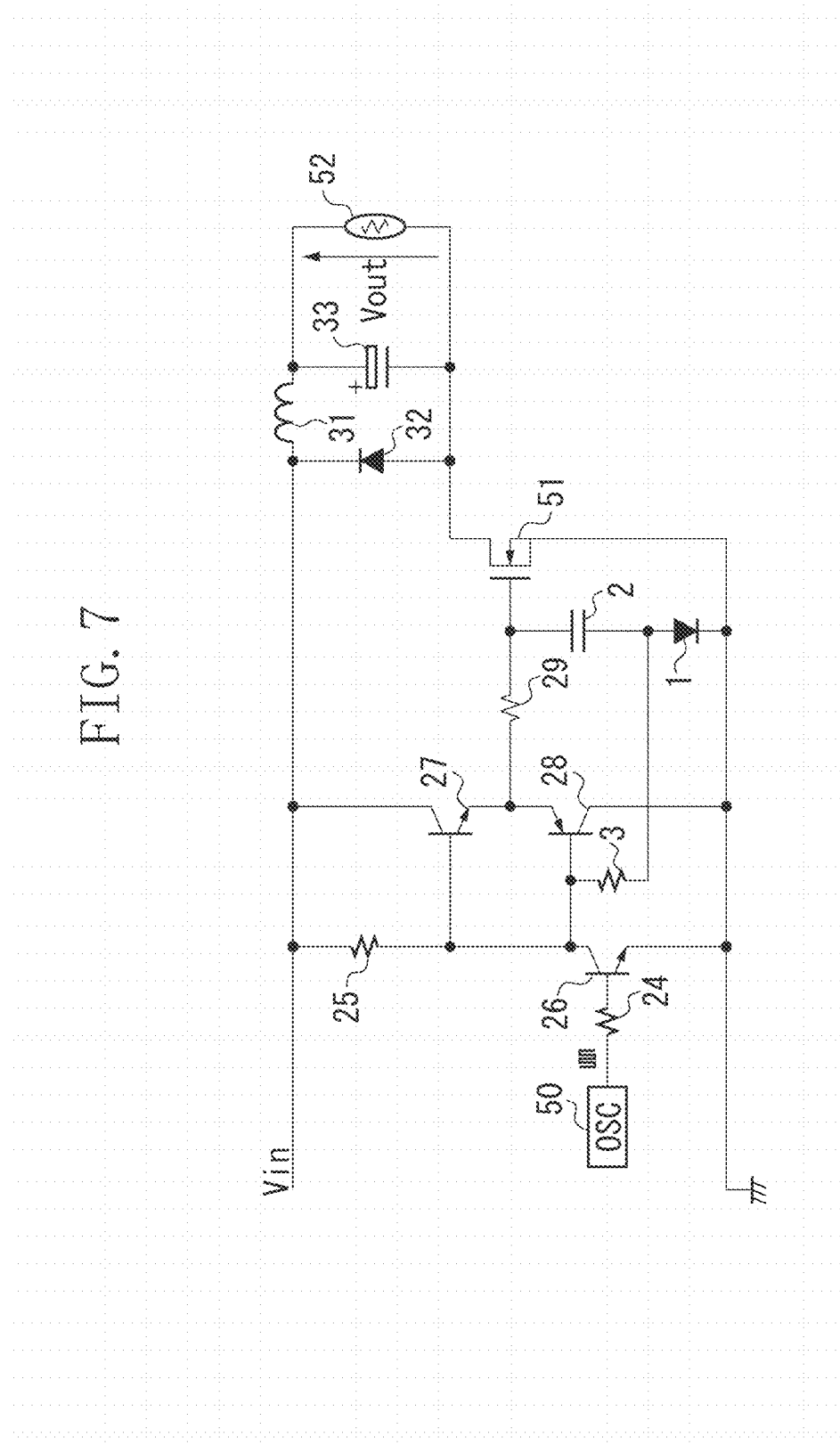
FIG. 7 illustrates a light amount control circuit according to the second exemplary embodiment.

The second exemplary embodiment is applicable to various other configurations other than the DC/DC converter. For example, as illustrated in FIG. 7, the second exemplary embodiment is applicable to a light amount control circuit for driving a light source 52.

Next, a third exemplary embodiment of the present invention will be described. The third exemplary embodiment will be described based on an example where the DC/DC converter of the first exemplary embodiment is arranged downstream of an alternating current/direct current (AC/DC) converter. In recent years, there is an increasing demand for further reduction of the standby power of electronic apparatuses, and electronic apparatuses are expected to have the power source configured to be capable of reducing the standby power.

The third exemplary embodiment will be described based on an example where a power source having an AC/DC converter and a DC/DC converter is used in an apparatus having a normal mode and a power save mode having less power consumption than that of the normal mode. The third exemplary embodiment will be described, assuming that the apparatus includes a switching power source using an FET functioning as a switching element and that the apparatus is capable of reducing the standby power by changing the operation status of the power source when set in the power save mode. The parts and elements of the third exemplary embodiment similar to those of the above first and second exemplary embodiments are denoted by the same reference characters, and the description thereof will not be repeated.

Figure 8:
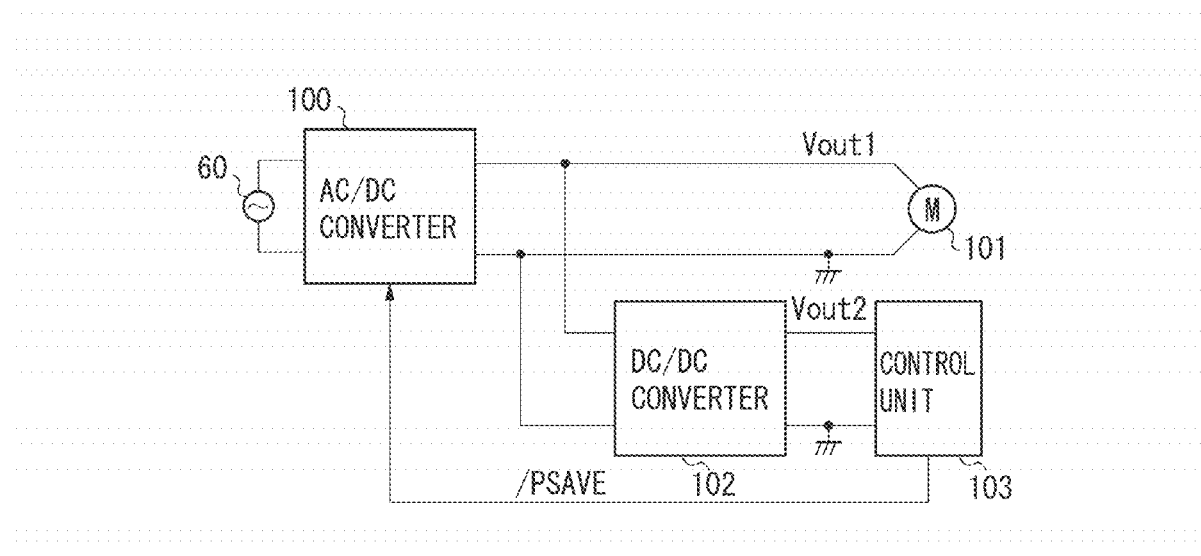
FIG. 8 is a block diagram illustrating a circuit of an electronic apparatus power source according to a third exemplary embodiment of the present invention.

FIG. 8 illustrates a block diagram of the apparatus according to the third exemplary embodiment. In FIG. 8, an AC/DC converter 100 transforms the alternating voltage of a commercial power supply 60 into a DC voltage Vout1, and an actuator 101, such as a motor in an apparatus, receives the DC voltage Vout1. In addition, a DC/DC converter 102 receives and transforms the DC voltage Vout1 into a DC voltage Vout2, and a control unit 103 configured to control the apparatus receives the DC voltage Vout2.

The power source voltage Vout1 supplied to the actuator 101 is set higher than the power source voltage Vout2 supplied to the control unit 103. For example, these voltages are generally set as follows: Vout1=24.0 V (DC voltage) and Vout2=3.30 V (DC voltage). The following description will be made, assuming that Vout1=24.0 V and Vout2=3.30 V.

Figure 9:
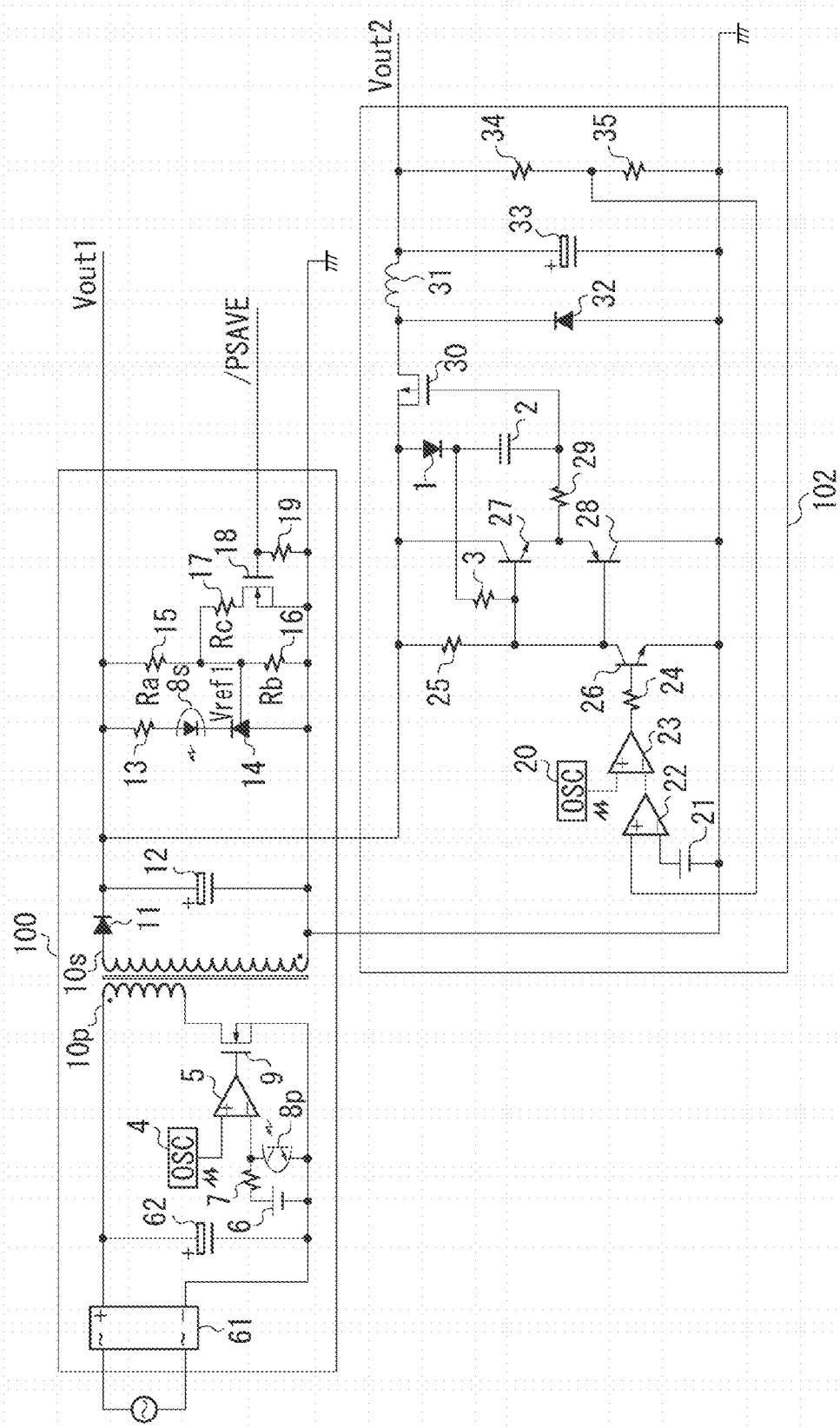
FIG. 9 is a circuit diagram of the power source according to the third exemplary embodiment.

FIG. 9 illustrates detailed circuit configurations of the AC/DC converter 100 and the DC/DC converter 102 of FIG. 8, and first, the AC/DC converter 100 of FIG. 9 will be described. A bridge diode 61 and a primary smoothing capacitor 62 rectify and smooth the alternating voltage of the commercial power supply 60 to obtain a DC voltage. An FET 9 receives this DC voltage via a primary transformer winding 10p. The gate terminal of the FET 9 is connected to a pulse width modulation (PWM) circuit formed by a comparator 5, a triangular wave generator (OSC) 4, a constant voltage source 6, a resistor 7, and a photocoupler 8p. Thus, the FET 9 executes a PWM switching operation, based on output voltage difference information fed back to the photocoupler 8p. This PWM switching operation generates a pulse voltage across a secondary transformer winding 10s. A diode 11 and a secondary smoothing capacitor 12 rectify and smooth the pulse voltage to obtain the DC voltage Vout1. An error amplification circuit formed by resistors 15, 16, and 13, a shunt regulator 14, and a photocoupler 8s receives the DC voltage Vout1. Thus, the FET 9 executes a PWM switching operation based on DC voltage (Vout1) difference information. In this way, the DC voltage Vout1 is maintained at a constant level.

Since the DC/DC converter 102 is similar to the step-down DC/DC converter described in the first exemplary embodiment, except that the DC/DC converter 102 receives the output voltage Vout1 from the AC/DC converter 100, the operation of the DC/DC converter 102 will not be repeated herein.

Next, the power source in the third exemplary embodiment illustrated in FIG. 8 will be described. First, an operation of each of the converters in the power save mode will be described with reference to FIGS. 8 and 9. As illustrated in FIG. 8, the control unit 103 supplies the AC/DC converter 100 with a power save signal (hereinafter referred to as a /PSAVE signal). The control unit 103 uses this /PSAVE signal to set the apparatus (power source) in the power save mode.

When the control unit 103 sets the apparatus in the normal mode, the control unit 103 sets the /PSAVE signal at a high level. In contrast, when the control unit 103 sets the apparatus in the power save mode, the control unit 103 sets the /PSAVE signal at a low level. The control unit 103 supplies the /PSAVE signal to an FET 18 of the error amplification circuit of the AC/DC converter 100. In the normal mode, namely, when the /PSAVE signal is at a high level, the FET 18 is turned on, and the resistors 16 and 17 are connected in parallel to each other. The resistor 15 and these resistors connected in parallel to each other (hereinafter referred to as resistors 16//17) divide the output voltage Vout1, and the reference terminal of the shunt regulator 14 receives the divided voltage. Thus, assuming that the resistance values of the resistors 15, 16, and 17 are Ra, Rb, and Rc, respectively, and the reference voltage of the shunt regulator is Vref1, an output voltage Vout1-N in the normal mode is generally represented by the following formula (1):

$$Vout1 - N \cong \frac{Ra + (Rb // Rc)}{(Rb // Rc)} \cdot Vref1 \tag{1}$$

In the above formula (1), (Rb//Rc) represents a parallel resistance value of the resistance values Rb and Rc, and the parallel resistance value can be represented by the following formula (2):

$$Rb // Rc = \frac{Rb \cdot Rc}{Rb + Rc} \tag{2}$$

In the power save mode, namely, when the /PSAVE signal is at a low level, the FET 18 is turned off and the resistor 17 is separated. Thus, the resistors 15 and 16 divide the output voltage Vout1, and the reference terminal of the shunt regulator 14 receives the divided voltage. Therefore, an output voltage Vout1-S in the power save mode is generally represented by the following formula (3).

$$Vout1 - s \cong \frac{Ra + Rb}{Rb} \cdot Vref1 \tag{3}$$

Consequently, the output voltage Vout1-S in the power save mode is lower than the output voltage Vout1-N in the normal mode.

The output voltage Vout2 of the DC/DC converter 102 can be similarly obtained. The resistors 34 and 35 divide the output voltage Vout2, and the comparator 22 in the error amplification circuit receives the divided voltage and compares the divided voltage with a voltage supplied from the constant voltage source 21. Thus, assuming that the resistance values of the resistors 34 and 35 are Rd and Re, respectively, and the voltage supplied from the constant voltage source 21 is Vref2, the output voltage Vout2 is generally represented by the following formula (4):

$$Vout2 \cong \frac{Rd + Re}{Re} \cdot Vref2 \tag{4}$$

The resistance values Ra, Rb, Rc, Rd, and Re are set, so that the output voltages of the AC/DC converter 100 and the DC/DC converter 102 determined by the above formulas have values as indicated by the following formulas (5), (6), and (7). It is important that the output voltage Vout1-S of the AC/DC converter 100 in the power save mode be set slightly lower than the output voltage Vout2 of the DC/DC converter 102. The third exemplary embodiment is described based on an example where the output voltage Vout2 is set to be a predetermined voltage 3.30 V and the output voltage Vout1-S is set to 3.20 V, which is lower than the predetermined voltage 3.30 V. Again, it is important that the output voltage Vout1-S be set slightly lower than the output voltage Vout2, and thus, these output voltage setting values of the third exemplary embodiment are used as an example. These setting values can be set appropriately, depending on the circuit configuration, the apparatus with which the output voltages are supplied, and the like. The output voltage Vout1-S needs to be set within an operating voltage of the control unit 103.

$$Vout1 - N \cong \frac{Ra + (Rb // Rc)}{(Rb // Rc)} \cdot Vref1 = 24.0 \text{ [V]} \tag{5}$$

$$Vout1 - S \cong \frac{Ra + Rb}{Rb} \cdot Vref1 = 3.20 \text{ [V]} \tag{6}$$

$$Vout2 \cong \frac{Rd + Re}{Re} \cdot Vref2 = 3.30 \text{ [V]} \tag{7}$$

Figure 10:
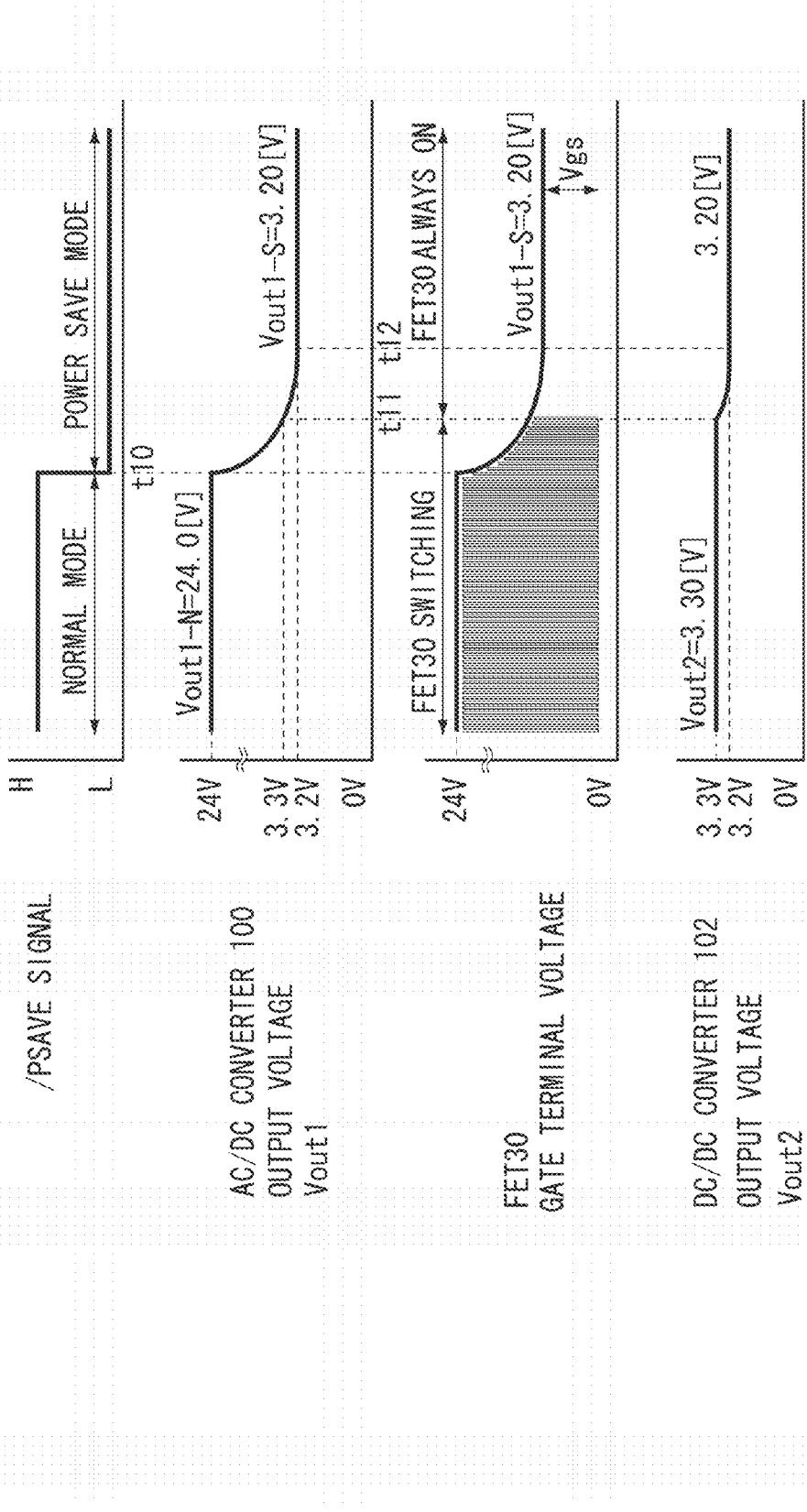
FIG. 10 illustrates voltage waveforms obtained during an operation of the power source circuit according to the third exemplary embodiment.

FIG. 10 illustrates a switching operation from the normal mode to the power save mode when the configuration of FIG. 9 is set as described above. In FIG. 10, before time t10, the control unit 103 sets the /PSAVE signal at a high level, namely, the apparatus is set in the normal mode. Thus, the output voltage Vout1-N of the AC/DC converter 100 is 24.0 V, and the output voltage Vout2 of the DC/DC converter 102 is 3.30 V. The gate terminal of the FET 30 receives a PWM switching pulse, and the FET 30 executes a switching operation.

At time t10, the control unit 103 changes the /PSAVE signal to a low level to set the apparatus in the power save mode. Accordingly, the output voltage Vout1 of the AC/DC converter 100 starts to decrease, and after time t12, the output voltage reaches 3.20 V.

The operation of the DC/DC converter 102 during this process will be next examined. When the output voltage of the AC/DC converter 100 is 3.30 V or more, since the gate terminal of the FET 30 receives a PWM switching pulse, the FET 30 executes a switching operation. Thus, the DC/DC converter 102 has a constant output voltage of 3.30 V.

When the output voltage of the AC/DC converter 100 falls below 3.30 V after time t11, since the output voltage of the DC/DC converter 102 cannot maintain its control target voltage 3.30 V, the FET 30 comes into an always-on state. Namely, the FET 30 does not execute a switching operation but comes into an always-conductive state. Thus, the output voltage of the DC/DC converter 102 becomes approximately equal to the output voltage of AC/DC converter 100 and reaches 3.20 V after time t12.

As described above, in the power save mode, the output voltage of the AC/DC converter 100 is decreased to lower than the control target voltage of the DC/DC converter 102, and the FET 30 of the DC/DC converter 102 comes into an always-on state. Since the output voltage Vout1 of the AC/DC converter 100 is decreased in this way, the power consumption loss of the actuator 101 is decreased. Additionally, since the FET 30 stops the switching operation, switching loss is eliminated. Namely, reduction of power loss and elimination of switching loss can be achieved.

In the above description, the FET 30 comes into an always-on state when the output voltage Vout1-S reaches 3.20 V. To turn on the FET 30 completely when the output voltage Vout1-S reaches 3.20 V, an FET having a Vgs on-threshold voltage of at least 3.20 V or less needs to be used. In the third exemplary embodiment, as in the first exemplary embodiment, an FET having a Vgs on-threshold voltage of 2.5 V (minimum) and a cutoff voltage of 0.5 V (minimum) to 1.5 V (maximum) is used.

The third exemplary embodiment also has a configuration using an FET similar to that of the first exemplary embodiment. Namely, as described in the first exemplary embodiment, the third exemplary embodiment includes a bootstrap circuit formed by the diode 1 and the capacitor 2 to charge the capacitor 2 during a turn-on period of the FET 30. During a turn-off period of the FET 30, the charging voltage of the capacitor 2 is used to turn on the transistor 27. In this way, the saturation voltage of the transistor 27 can be decreased, and a circuit configuration for turning off the FET completely can be realized. The circuit configuration and operation of the third exemplary embodiment are similar to those of the first exemplary embodiment, and, therefore, the description thereof will not be repeated.

As described above, such an FET used in a DC/DC converter of an apparatus (power source) having a power save mode can be turned on completely, and as a result, the circuit operation can be stabilized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-14.9066 filed Jun. 23, 2009, which is hereby incorporated by reference herein in its entirety.

What is claimed is:

1. A driving circuit comprising:
   a field-effect transistor (FET) configured to switch an input voltage;
   a switching element configured to drive the FET, the switch element being connected to a gate terminal of the FET;
   a capacitor configured to store a voltage applied between the gate terminal of the FET and a source terminal of the FET during an on-period of the FET; and
   a rectification element that connects to the capacitor,
   wherein one terminal of the rectification element is connected to the source terminal of the FET, another terminal of the rectification element is connected to one terminal of the capacitor, and another terminal of the capacitor is connected to the gate terminal of the FET,
   wherein the voltage stored in the capacitor is supplied to the switch element during an off-period of the FET,
   wherein the FET includes an N-channel FET, and the switch element includes a PNP transistor,
   wherein a gate terminal of the N-channel FET is connected to an emitter terminal of the PNP transistor, a source terminal of the N-channel FET is connected to a collector terminal of the PNP transistor and a cathode terminal of the diode, the capacitor is connected to an anode terminal of the diode and the gate terminal of the N-channel FET, and a base terminal of the PNP transistor is connected to a connection point between the anode terminal of the diode and the capacitor, and
   wherein, during an on-period of the N-channel FET, the capacitor is charged with a voltage applied between the gate and source terminals of the N-channel FET, and during an off-period of the N-channel FET, the capacitor supplies a base current to the PNP transistor.

2. The driving circuit according to claim 1, wherein, when a voltage input to the FET is at a predetermined level, the FET is driven, and when the voltage input to the FET is changed to a level lower than the predetermined level, the FET is driven to maintain an on-state.

3. A converter comprising:
   a field-effect transistor (FET) configured to switch an input voltage;
   a switching element configured to drive the FET, the switch element being connected to a gate terminal of the FET;
   an output unit configured to rectify, smooth, and output a pulse voltage output when the switch element drives the FET;
   a capacitor configured to store a voltage applied between the gate terminal of the FET and a source terminal of the FET during an on-period of the FET; and
   a rectification element that connects to the capacitor,
   wherein one terminal of the rectification element is connected to the source terminal of the FET, another terminal of the rectification element is connected to one terminal of the capacitor, and another terminal of the capacitor is connected to the gate terminal of the FET, and
   wherein the voltage stored in the capacitor is supplied to the switch element during an off-period of the FET, and the switch element is turned on to turn off the FET,
   wherein the FET includes an N-channel FET, and the switch element includes a PNP transistor,
   wherein a gate terminal of the N-channel FET is connected to an emitter terminal of the PNP transistor, a source terminal of the N-channel FET is connected to a collector terminal of the PNP transistor and a cathode terminal of the diode, the capacitor is connected to an anode terminal of the diode and the gate terminal of the N-channel FET, and a base terminal of the PNP transistor to a connection point between the anode terminal of the diode and the capacitor, and wherein, during an on-period of the N-channel FET, the capacitor is charged with a voltage applied between the gate and source terminals of the N-channel FET, and during an off-period of the N-channel FET, the capacitor supplies a base current to the PNP transistor.

4. The converter according to claim 3, wherein, when a voltage input to the converter is at a predetermined level, the FET is driven, and when the voltage input to the converter is changed to a level lower than the predetermined level, the FET is driven to maintain an on-state.

* * * * *